(12) United States Patent
Granneman et al.

(10) Patent No.: US 10,738,382 B2
(45) Date of Patent: Aug. 11, 2020

(54) SUBSTRATE PROCESSING APPARATUS (71) Applicant: ASM INTERNATIONAL N.V., Almere (NL)

(72) Inventors: Ernst Hendrik August Granneman, Almere (NL); Pieter Tak, Almere (NL)

(73) Assignee: ASM INTERNATIONAL N.V., Almere (NL)

( * ) Notice: Subject to any disclaimer, the term of this patent is extended or adjusted under 35 U.S.C. 154(b) by 582 days.

(21) Appl. No.: 14/777,945

(22) PCT Filed: Mar. 18, 2014

(86) PCT No.: PCT/NL2014/050159
§ 371 (c)(1),
(2) Date: Sep. 17, 2015

(87) PCT Pub. No.: WO2014/148893
PCT Pub. Date: Sep. 25, 2014

(65) Prior Publication Data
US 2016/0281233 A1  Sep. 29, 2016

(30) Foreign Application Priority Data

Mar. 18, 2013  (NL) .................................... 2010471

(51) Int. Cl.
*C23C 16/455* (2006.01)
*H01L 21/677* (2006.01)
(Continued)

(52) U.S. Cl.
CPC ........ *C23C 16/45544* (2013.01); *B65G 51/03* (2013.01); *C23C 16/4412* (2013.01);
(Continued)

(58) Field of Classification Search
CPC ............ C23C 16/4409; C23C 16/4412; C23C 16/45544; C23C 16/45551;
(Continued)

(56) References Cited

U.S. PATENT DOCUMENTS 3,588,176 A    6/1971  Byrne et al.
4,495,024 A *  1/1985  Bok .......................... G03F 7/16
                                                              118/50

(Continued)

FOREIGN PATENT DOCUMENTS

WO   WO 2011/062490       5/2011
WO   WO-2011093709 A1 *   8/2011    ....... C23C 16/45551
(Continued)

OTHER PUBLICATIONS

BESSEY® Auto-Adjust Toggle Clamp Brochure. BESSEY Group: https://www.bessey.de. 2012. pp. 1-2. (Year: 2012).*

*Primary Examiner* — Jeffrie R Lund
*Assistant Examiner* — Stanislav Antolin
(74) *Attorney, Agent, or Firm* — Preti Flaherty Beliveau & Pachios LLP (57) ABSTRACT

A substrate processing apparatus (100) comprising a process tunnel (102) including a lower tunnel wall (122), an upper tunnel wall (142), and two lateral tunnel walls (128), said tunnel walls being configured to bound a process tunnel space (104) that extends in a longitudinal transport direction (7) and that is suitable for accommodating at least one substantially planar substrate (180) oriented parallel to the upper and lower tunnel walls (122, 142), the process tunnel being divided in a lower tunnel body (120) comprising the lower tunnel wall and an upper tunnel body (140) comprising the upper tunnel wall, which tunnel bodies (120, 140) are separably joinable to each other along at least one longitudinally extending join (160), such that they are mutually movable between a closed configuration in which the tunnel (Continued)

walls (122, 128, 142) bound the process tunnel space (104) and an open configuration that enables lateral maintenance access to an interior of the process tunnel.

6 Claims, 5 Drawing Sheets

(51) Int. Cl.
*B65G 51/03* (2006.01)
*C23C 16/54* (2006.01)
*C23C 16/44* (2006.01)

(52) U.S. Cl.
CPC .. *C23C 16/45551* (2013.01); *C23C 16/45557* (2013.01); *C23C 16/54* (2013.01); *H01L 21/67784* (2013.01)

(58) Field of Classification Search
CPC ... C23C 16/45557; C23C 16/52; C23C 16/54; H01L 21/0228; H01L 21/6719; H01L 21/67259; H01L 21/67276; H01L 21/67748; H01L 21/6776; H01L 21/67784; Y10T 16/52; Y10T 16/5275; Y10T 16/529; Y10T 16/53225; Y10T 16/5324; Y10T 16/53247; Y10T 29/49815; Y10T 29/49826; B65G 49/065; B65G 51/02; B65G 51/03; H01J 37/32513; H01J 37/3288
See application file for complete search history.

(56) References Cited

U.S. PATENT DOCUMENTS

| | | | |
|---|---|---|---|
| 4,521,268 A * | 6/1985 | Bok | G03F 7/16 118/50 |
| 4,600,471 A * | 7/1986 | Bok | G03F 7/16 156/345.11 |
| 4,622,918 A * | 11/1986 | Bok | H01L 21/67173 118/718 |
| 4,662,987 A * | 5/1987 | Bok | H01L 21/67784 216/91 |
| 4,681,776 A * | 7/1987 | Bok | H01L 21/67784 134/21 |
| 5,194,406 A * | 3/1993 | Bok | H01L 21/67784 118/50 |
| 5,209,387 A * | 5/1993 | Long | B65H 20/14 226/97.3 |
| 6,273,955 B1 * | 8/2001 | Yoshino | C23C 16/24 118/718 |
| 6,315,501 B1 * | 11/2001 | Yagai | H01L 21/67784 406/191 |
| 6,338,872 B1 * | 1/2002 | Yoshino | C23C 16/24 118/715 |
| 8,501,025 B2 | 8/2013 | Hashizume et al. | |
| 9,347,563 B2 * | 5/2016 | Pocza | H01L 21/67126 345/204 |
| 2002/0033232 A1 * | 3/2002 | Raaijmakers | C23C 16/44 156/345.12 |
| 2003/0131794 A1 * | 7/2003 | Rosenstein | C23C 14/35 118/722 |
| 2003/0169524 A1 * | 9/2003 | Adin | B65G 51/03 359/896 |
| 2003/0196760 A1 * | 10/2003 | Tyler | H01J 37/32082 156/345.47 |
| 2003/0221780 A1 | 12/2003 | Lei et al. | |
| 2004/0087168 A1 * | 5/2004 | Granneman | C23C 16/45521 438/706 |
| 2005/0095873 A1 * | 5/2005 | Granneman | H01L 21/324 438/795 |
| 2005/0098114 A1 * | 5/2005 | Christensen | C23C 16/4401 118/719 |
| 2005/0170306 A1 * | 8/2005 | Maria Oosterlaken | H01L 21/67126 432/241 |
| 2005/0211386 A1 * | 9/2005 | Hamelin et al. | C23C 16/4405 156/345.52 |
| 2006/0062900 A1 * | 3/2006 | Selvamanickam | C23C 16/408 427/62 |
| 2006/0071384 A1 * | 4/2006 | Lee | B23Q 11/0891 269/55 |
| 2007/0095477 A1 * | 5/2007 | Arita | H01J 37/32009 156/345.47 |
| 2007/0157683 A1 * | 7/2007 | Li | C23C 16/4401 70/209 |
| 2007/0212174 A1 | 9/2007 | Hayashi et al. | |
| 2007/0296715 A1 * | 12/2007 | Shimai | H01L 21/67126 345/204 |
| 2009/0016854 A1 * | 1/2009 | Morohashi | H01L 21/67017 414/161 |
| 2009/0081885 A1 * | 3/2009 | Levy | C23C 16/45519 438/778 |
| 2009/0263216 A1 * | 10/2009 | Favre | H01L 21/67017 414/222.02 |
| 2009/0291209 A1 * | 11/2009 | Granneman | C23C 16/45551 427/255.5 |
| 2009/0310648 A1 * | 12/2009 | Granneman | G01K 5/28 374/201 |
| 2009/0324379 A1 * | 12/2009 | He | C23C 16/45519 414/800 |
| 2010/0003769 A1 * | 1/2010 | Kuznetsov | H01L 21/67265 438/5 |
| 2010/0047447 A1 * | 2/2010 | Cook | C23C 16/45563 427/248.1 |
| 2010/0202860 A1 * | 8/2010 | Reed | H01L 21/68742 414/221 |
| 2011/0041769 A1 * | 2/2011 | Lee | C23C 16/44 118/733 |
| 2011/0139072 A1 * | 6/2011 | Tamagaki | C23C 14/24 118/718 |
| 2011/0183073 A1 * | 7/2011 | Sato | G03F 7/3021 427/299 |
| 2011/0268879 A1 * | 11/2011 | Granneman | C23C 16/54 427/255.5 |
| 2012/0091871 A1 * | 4/2012 | Lim | H01J 37/32091 312/319.1 |
| 2012/0291707 A1 * | 11/2012 | Granneman | H01L 21/67784 118/724 |
| 2013/0052346 A1 * | 2/2013 | Higashi | C23C 16/45519 427/248.1 |
| 2013/0052347 A1 * | 2/2013 | Kuznetsov | C23C 14/568 427/248.1 |
| 2013/0126092 A1 * | 5/2013 | Sexton | H01J 37/3288 156/345.1 |
| 2013/0199448 A1 * | 8/2013 | Granneman | C23C 16/45519 438/778 |
| 2013/0291949 A1 * | 11/2013 | Pocza | C23C 16/45519 414/800 |

FOREIGN PATENT DOCUMENTS

| | | | | |
|---|---|---|---|---|
| WO | WO-2012005577 A1 * | 1/2012 | | B65G 51/03 |
| WO | WO-2012055510 A1 * | 5/2012 | | C23C 14/56 |
| WO | WO-2012105831 A1 * | 8/2012 | | C23C 16/45551 |
| WO | WO 2013/009184 A1 | 1/2013 | | |
| WO | WO-2013009184 A1 * | 1/2013 | | H01L 21/67784 |
| WO | WO-2012055510 A9 * | 8/2013 | | C23C 14/56 |

* cited by examiner

Fig. 6

SUBSTRATE PROCESSING APPARATUS

FIELD OF THE INVENTION

The present invention relates to a high-throughput substrate processing apparatus for processing double-floatingly supported substrates during transport through a process tunnel.

BACKGROUND

International patent application publication WO 2011/062490 in the name of Levitech B.V. discloses a substrate processing apparatus including a process tunnel through which semiconductor substrates may be contactlessly advanced in rapid succession while being subjected to a variety of treatments such as, for example, spatial atomic layer deposition (ALD) and annealing. A problem addressed in WO'490 is that the substrates, which are floatingly supported between an upper and lower gas bearing, may become destabilized by gas flows necessary to maintain the gas bearings. Consequently, the substrates may stray from their predetermined trajectory towards the edges of the gas bearings and/or undergo angular displacements, as a result of which they may collide with and/or get stuck between the walls bounding the process tunnel. Although the lateral stabilization mechanism proposed by WO'490 works satisfactorily in significantly reducing the occurrence rate of such events, practice has taught that substrate-wall contacts may not be prevented entirely.

In the event that a substrate-wall contact involves fracture of the substrate and/or congestion of the process tunnel, quick and convenient access to the tunnel space is desired in order to enable operators to remedy the situation and to effect prompt resumption of the production process. The same applies, of course, in case a substrate fractures or gets stuck for other reasons. In practice, for instance, a substrate may already be slightly damaged upon insertion into the process tunnel. If such a substrate is then rapidly heated as part of a (pre-)anneal treatment, the thermal expansion of the cracked substrate may cause it to break into pieces.

SUMMARY OF THE INVENTION

It is therefore an object of the present invention to provide for an adapted version of the substrate processing apparatus discussed in WO'490, which adapted version enables an operator to quickly access the process tunnel space in order to remedy any problems therein, and to effect a prompt continuation of operation, preferably within about 10-30 minutes after detection of the problem.

To this end, a first aspect of the present invention is directed to a substrate processing apparatus. The apparatus may comprise a process tunnel including a lower tunnel wall, an upper tunnel wall, and two lateral tunnel walls. The tunnel walls may be configured to bound a process tunnel space that extends in a longitudinal transport direction and that is suitable for accommodating at least one substantially planar substrate oriented parallel to the upper and lower tunnel walls. The apparatus may also comprise a plurality of gas injection channels provided in both the lower and the upper tunnel wall. Gas injection channels in the lower tunnel wall may be configured to provide for a lower gas bearing, while the gas injection channels in the upper tunnel wall may be configured to provide for an upper gas bearing. The gas bearings may be configured to floatingly support and accommodate the substrate there between. The substrate processing apparatus may also comprise a plurality of gas exhaust channels provided in both the lateral tunnel walls. Alternatively the exhaust channels may be provided in at least one of the upper and the lower tunnel wall directly adjacent both lateral walls. In this respect "directly adjacent" means within a distance of less than 5 mm and more preferably less than 2 mm from the associated lateral wall. Preferably, "directly adjacent" also means that a said exhaust channel in the upper or the lower tunnel wall is positioned so close to one of said lateral walls that a circumferential edge of said gas exhaust channel in the upper or lower tunnel wall touches that associated lateral wall. The gas exhaust channels in or directly adjacent each lateral tunnel wall may be spaced apart in the transport direction. The process tunnel may be divided in a lower tunnel body comprising the lower tunnel wall and an upper tunnel body comprising the upper tunnel wall. The tunnel bodies may be separably joinable to each other along at least one longitudinally extending join, such that they are mutually movable between a closed configuration in which the tunnel walls bound the process tunnel space and an open configuration that enables lateral maintenance access to an interior of the process tunnel.

During operation, the tunnel bodies may be in the closed configuration. In case a substrate then breaks or gets stuck inside the process tunnel, the transport of further substrates through the tunnel may be paused, and the tunnel bodies may be separated or disjoined and be brought into their open configuration in order to allow an operator to access the interior of the process tunnel to remove the broken or stuck substrate.

The respective tunnel bodies may preferably extend over the entire length of the process tunnel (typically at least several meters, e.g. 5-15 meters), and be unitary so as to be movable relative to each other as respective wholes. Accordingly, opening and closing the process tunnel may mean opening and closing the process tunnel over its entire length. In such a configuration, an operator seeking to remedy a problem within the tunnel space does not need to localize the problem before accessing the tunnel, which provides an improvement over an embodiment in which, for instance, the upper tunnel body is comprised of respective, longitudinally arranged upper tunnel sub-bodies that are movable relative to a unitary lower tunnel body. In the case of a congestion, an operator of this latter embodiment would have to decide which of the upper tunnel sub-bodies he should (re)move to get access to the interior of the process tunnel. The congestion, however, may be difficult to localize, and may not be confined to a single location in the process tunnel. Furthermore, in particular when heated gases are used for the gas bearings, (re)moving one or more upper tunnel sub-bodies may cause them to cool at a different rate than the remaining upper tunnel sub-bodies (which, conversely, may be given room to expand), as a result of which the (re)moved upper tunnel sub-bodies may not seamlessly fit back into place before the entire process tunnel has cooled down. Since such cooling of the process tunnel may take hours, and corresponds to downtime of the apparatus, a configuration with separate upper or lower tunnel sub-bodies may best be avoided.

The upper and lower tunnel bodies may be movable relative to each other in various ways. In one embodiment, for instance, the upper and lower tunnel bodies may be movably connected along a longitudinally extending axis around which they may hinge or pivot relative to each other in a clamshell-like fashion. In another, preferred embodiment the upper and lower tunnel bodies may be completely separable from one another. The apparatus may, for instance, comprise a clamp (device) or press, e.g. a hydraulic clamp/press, configured to force the upper and lower tunnel bodies together to effect the closed configuration. In an embodiment, the clamp or press may additionally be configured to separate the upper and lower tunnel bodies in order to effect the open configuration. Completely separable upper and lower tunnel bodies may generally be preferred as they enable a tighter-closed configuration:

hinges and the like require mechanical play that may be at variance with the desire to effect tight joins between the upper and lower tunnel bodies. However, in an embodiment, the substrate processing apparatus may include a hinge that is connected with both the upper and the lower tunnel body and that is configured to hinge the upper tunnel body relative to the lower tunnel body in order to effect the open configuration and to bring the upper and lower tunnel bodies together along the a least longitudinally extending join. When the bodies are brought together by means of the hinge, again at least one clamp or a press may force the upper and the lower tunnel bodies together along the at least one longitudinally extending join to effect the closed configuration in which a tight join between the upper and the lower tunnel bodies is effected.

In a typical embodiment fitted with a clamp or press, the upper and lower tunnel walls may be substantially flat, while the press may be configured to move the upper and lower tunnel bodies with the upper and lower tunnel walls in a parallel relationship.

In an embodiment of the apparatus, the lower tunnel body may comprise the two lateral tunnel walls, such that its lower tunnel wall and lateral tunnel walls together define a longitudinally extending open channel having a generally U-shaped transverse cross-sectional profile. Having the lower tunnel body instead of the upper tunnel body include the lateral tunnel walls prevents substrates present in the process tunnel from inadvertently sliding or floating out under the action of gravity when the tunnel is opened; the lateral walls will contain the substrates, and any debris, thus facilitating their removal.

In another embodiment, at least one and preferably both of the lateral tunnel walls may define a respective flat upward facing join surface, while the upper tunnel wall may be substantially flat and define one or more respective flat downward facing join surface(s) that is/are configured to abut the respective flat upward facing join surface(s) in the closed configuration, so as to define the at least one longitudinally extending join.

The contactless transport of double-floatingly supported substrates through the process tunnel is a process to which an accurately controlled pressure distribution inside the process tunnel is of paramount importance. This is true whether the transport is driven by gravity, as discussed in for instance WO 2009/142,487 (Granneman et al.) in the name of ASM International N.V., or through a longitudinal pressure distribution, as described in WO 2012/005,577 (Granneman et al.) in the name of Levitech B.V. Uncontrolled pressure deviations as small as a few Pascals may destabilize or even halt substrates whizzing through the process tunnel.

Unfortunately, an inherent disadvantage of the process tunnel being divided into relatively movable upper and lower tunnel bodies is that at least one join, and typically two joins, exist between these tunnel bodies. These joins may not be completely fluid tight, and thus represent leaks through which gas may be exchanged between the process tunnel space and the environment. In particular in case the gases used inside the process tunnel space are toxic or mutually reactive, they may contaminate a clean room environment and/or affect the health of employees working therein; conversely, the exchange of gases might also contaminate the process tunnel space itself. To avoid chemical contamination of the process tunnel space through the inflow of environmental air, the gas bearings in the process tunnel space may typically be maintained at a slightly super-atmospheric pressure. This solution, however, neither prevents the uncontrolled leakage of process gases from the process tunnel space, nor the associated uncontrolled local pressure variations typically pressure drops adjacent the leak.

In line with general practice, one may attempt to avoid uncontrolled leakage and local pressure variations by making the joins as fluid tight as possible, for instance by applying an elongate O-ring along the joins between the tunnel bodies, and by additionally bolting the opposite tunnel bodies together along the join, so as to clamp the O-rings between the tunnel bodies to seal the join. In the present context, however, O-rings, are generally undesirable. Most O-rings cannot be used at temperatures above 150° C., and/or in chemically aggressive environments involving ALD-precursors such as trimethylaluminum (TMA). O-rings that would be suitable on technical grounds are very costly. Accordingly, the use of O-rings in the present context is rather uneconomical since the O-ring material would have to be provided along one or more joins extending the length of the entire process tunnel (typically about 5-10 meters). Moreover, the use of bolts to bolt the upper and lower tunnel bodies together is impractical as unbolting the upper and lower tunnel bodies along the entire length of the track would be very time-consuming (not only because of the number of bolts, but also because unbolting may require the process tunnel to have cooled down), and therefore hamper a fast remedy to a problem inside the process tunnel space.

As attempting to conventionally seal the joins is both uneconomical and impractical, the present disclosure suggests a different approach to solve the problem of uncontrolled leakage of gases into/from the process tunnel space caused by the presence of the joins. To enable this approach, the joins may be arranged such that they do not intersect the gas exhaust channels provided in or directly adjacent the lateral tunnel walls.

An external or downstream end of a gas exhaust channel in a lateral tunnel wall may typically be connected to a gas exhaust conduit to discharge process gas to a desired location. By ensuring that the gas exhaust channel is not intersected by a join, a fluid tight connection between the gas exhaust channel and the gas exhaust conduit is facilitated (this is because an upstream end of the gas exhaust conduit may now simply be permanently connected to the lateral wall, such that it is in fluid communication with the gas exhaust channel, without having to consider the relative movability of the tunnel bodies). Moreover, isolating the gas exhaust channel from the join enables a pressure drop across the join to be controlled independently from a pressure drop across the gas exhaust channel.

This latter aspect is key to two elaborations of the presently disclosed apparatus, in which pressure regulation means are provided, configured to equalize pressures on opposite sides of the join, such that a pressure drop $\Delta P_{join}$ across the join obeys $\Delta P_{join} \approx 0$. When the pressure drop across the join is successfully reduced to zero or at least approximately zero (i.e. '≈0', which may be quantified to mean '<10 Pascals', i.e. 'less than 10 Pascals'), there is substantially no pressure difference across the join to drive a gas flow. Consequently, there is effectively no leak either.

In a first of said elaborations, the pressure drop across a longitudinal, non-fluidtight (i.e. possibly leaking) part of the join may be controlled by exercising control over a pressure on an inside of said part of the join. More specifically, by controlling a gas pressure inside a gas exhaust channel adjacent said part of the join, a gas pressure at an upstream entrance of the gas exhaust channel, and thus at an inside of the join, may be equalized with an (environmental) pressure on an outside of the join.

In a second of said elaborations, the pressure drop across a longitudinal, non-fluidtight part of the join may be controlled by exercising control over a pressure on an outside of said part of the join. To this end, the pressure regulation means may, for instance, comprise an auxiliary containment that defines a buffer space configured to contain a preferably inert, pressurized buffer gas such as nitrogen, which buffer space is in fluid communication with (an outside of) the part of the join 160 across which the pressure drop is to be controlled. A gas pressure of the buffer gas in the buffer space may then be equalized with a (process gas) pressure on an inside of the join, inside the process tunnel space, so as to effect a zero pressure drop across the non-fluidtight part of the join.

These and other features and advantages of the invention will be more fully understood from the following detailed description of certain embodiments of the invention, taken together with the accompanying drawings, which are meant to illustrate and not to limit the invention.

DETAILED DESCRIPTION

Below, a basic exemplary embodiment of a substrate processing apparatus according to the present disclosure is described with reference to FIGS. 1-3. The exemplary embodiment is set up as a spatial atomic layer deposition (ALD) apparatus. It is understood, however, that the scope of application of the apparatus is not limited to the field of atomic layer deposition. The apparatus may alternatively be applied for the purpose of performing other substrate processing treatments, such as annealing.

Figure 1:
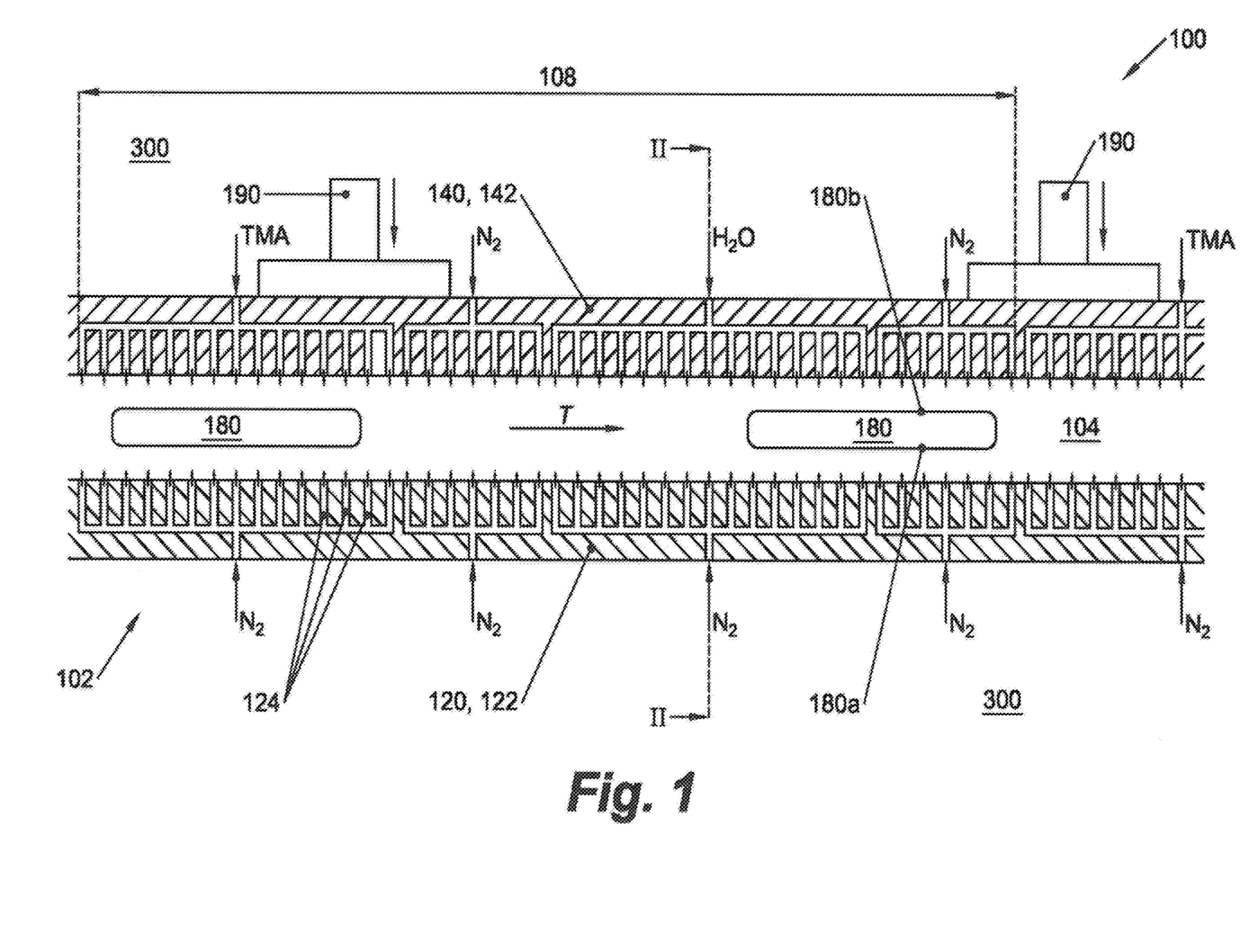
FIG. 1 schematically illustrates a cross-sectional side view of a longitudinal process tunnel section of an exemplary embodiment of a substrate processing apparatus according to the present disclosure.
Figure 2:
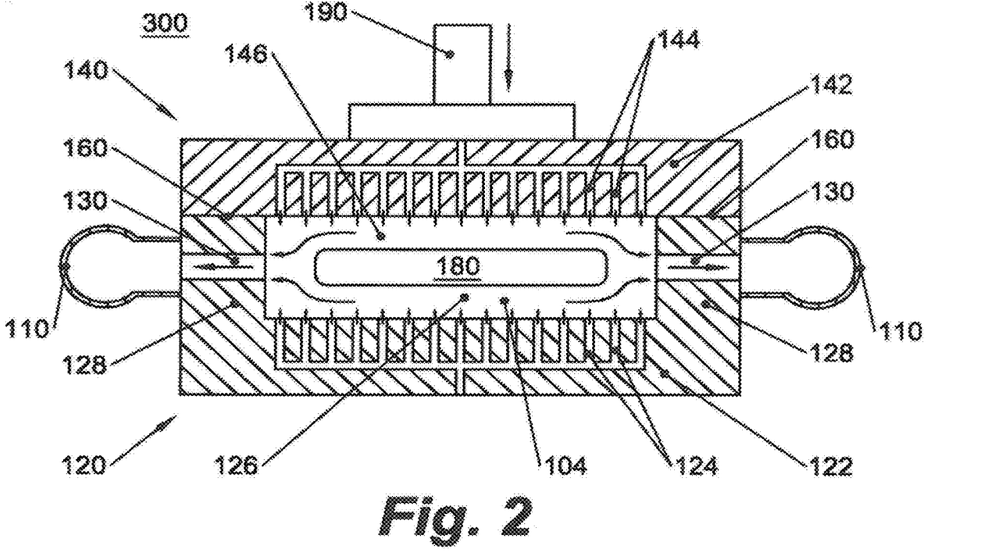
FIG. 2 schematically illustrates a lateral cross-sectional side view of the process tunnel section shown in FIG. 1, with the upper and lower tunnel bodies in a closed configuration (no leaks)
Figure 3:
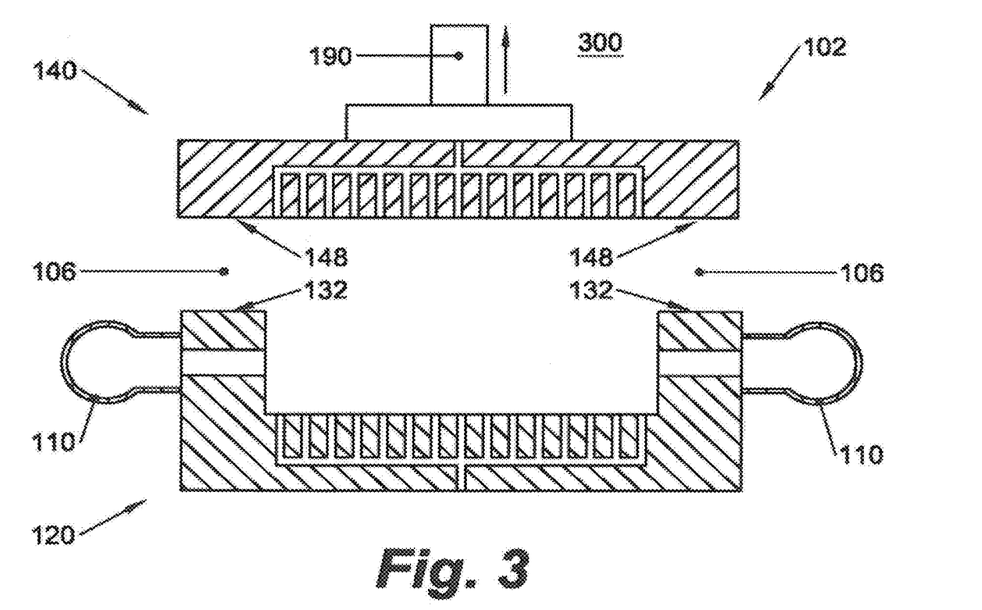
FIG. 3 schematically illustrates a lateral cross-sectional side view of the process tunnel section shown in FIG. 1, with the upper and lower tunnel bodies in an open configuration.

Referring now to FIGS. 1-3. The disclosed apparatus 100 may include a typically linear or straight process tunnel 102 through which a substrate 180, e.g. a silicon wafer, preferably as part of a train of substrates, may be conveyed in a uni-directional or bi-directional manner. That is, the substrate 180 may be inserted into the process tunnel 102 at an entrance thereof, and be uni-directionally conveyed to an exit. Alternatively, the process tunnel 102 may have a dead end and the substrate 180 may undergo a bi-directional motion from an entrance of the process tunnel, towards the dead end, and back to the entrance. Such an alternative bi-directional system may be preferred if an apparatus with a relatively small footprint is desired.

The process tunnel 102 may include both an elongate (i.e. longitudinally extending) lower tunnel body 120 and an elongate upper tunnel body 140. In a preferred embodiment, such as that shown in FIGS. 1-3, the lower tunnel body 120 may include a lower tunnel wall 122 and two lateral tunnel walls 128 that protrude upwardly from the lower tunnel wall 122 on respective, opposite lateral sides thereof; the upper tunnel body 140 may then include an upper tunnel wall 142 (see FIG. 2). In alternative embodiments, one or both of the lateral tunnel walls 128 may form part of the upper tunnel body 140 instead, and protrude downwardly from the upper tunnel wall. An advantage of having the lower tunnel body 120 include both lateral tunnel walls 128 is that it has a generally U-shaped transverse cross-sectional tunnel wall profile that, when the lower and upper tunnel bodies 120, 140 are separated from one another in an open configuration (see FIG. 3, to be described below), defines a longitudinally extending open channel which is still capable of containing substrates and substrate debris: the U-shaped wall profile of the lower tunnel body prevents any substrates and substrate debris from inadvertently sliding out under the action of gravity.

The lower and upper tunnel bodies 120, 140 may not be integrally formed, but be separably joinable/connectable to each other along at least one, and typically two, longitudinally extending join(s) 160 (see FIG. 2). The at least one join 160 may enable the lower and upper tunnel bodies 120, 140 to be movably arranged relative to each other, such that they are movable between a closed configuration and an open configuration. In the closed configuration (see FIGS. 1-2), the tunnel walls 122, 128, 142 may bound an elongate process tunnel space 104. In the open configuration (see FIG. 3), in which the tunnel bodies 120, 140 are at least partly separated from one another at the location of the join 160, the tunnel bodies may define at least one, and typically two, elongate access opening(s) or gap(s) 106 between them that enable(s) maintenance access to the interior of the process tunnel (i.e. to the space that, in the closed configuration, forms the process tunnel space 104) from a lateral side of the process tunnel 102.

The relative movability of the tunnel bodies 120, 140 may be realized in various ways. In one embodiment, for instance, the upper and lower tunnel bodies 120, 140 may be hingeably connected along a longitudinally extending axis around which they may pivot relative to each other in a clamshell-like fashion. In another, preferred embodiment, such as that depicted in FIGS. 1-3, the upper and lower tunnel bodies 120, 140 may be completely separable from one another. The apparatus 100 may, for instance, comprise one or more clamp devices or presses 190, e.g. hydraulic clamps/presses, configured to alternatively force the lower and upper tunnel bodies 120, 140 together to effect the closed configuration, and to separate them in order to effect the open configuration. In the depicted embodiment, the lower tunnel body 120 is fixedly connected to the world, while the upper tunnel body 140 is movably arranged by means of a series of longitudinally spaced apart presses 190 (FIG. 1), such that it can alternatively be pressed down on the lower tunnel body (FIG. 2) or be lifted therefrom (FIG. 3). Completely separable upper and lower tunnel bodies 120, 140 may generally be preferred as they enable a tighter-closed configuration: hinges and the like require mechanical play that is at variance with the desire to effect gastight joins between the upper and lower tunnel bodies 120, 140.

The at least one join 160 may be defined by two opposing join surfaces 132, 148 provided on the lower and upper tunnel bodies 120, 140, respectively. Flat, typically metal join surfaces may be preferred, as they may be sealingly pressed together. In an embodiment wherein the lower tunnel body 120 includes at least one lateral tunnel wall 128, this tunnel wall 128 may define a preferably flat upward facing join surface 132, while the upper tunnel body 140 may define a preferably flat downward facing join surface 148. The downward facing join surface 148 may be co-planar or flush with an inner surface of the upper wall 122, and be configured to abut the flat upward facing join surface 132 of the lateral wall 128 in the closed configuration of the tunnel bodies 120, 140. The downward facing join surface 148 may thus be formed as an elongate, lateral extension of the inner/lower surface of the upper tunnel wall 122. An advantage of having an upper tunnel body 140 with an entirely flat lower surface is that the successful (sealing) mating of the join surfaces 132, 148 is relatively insensitive to the precise lateral and/or longitudinal alignment of the lower and upper tunnel bodies 120, 140.

In the closed configuration, the lower and upper tunnel walls 122, 142 may be oriented horizontally or at an angle relative to the horizontal (e.g. to enable gravity driven substrate transport), be mutually parallel, and be spaced apart slightly, e.g. 0.5-1 mm, such that a substantially flat or planar substrate 180, having a thickness of for example 0.1-1 mm and oriented parallel to the upper and lower tunnel walls 122, 142, may be accommodated therebetween without touching them. Also in the closed configuration, the lateral tunnel walls 128, which may be oriented substantially vertically and be mutually parallel, may interconnect the lower and upper tunnel walls 122, 142 at their lateral sides. The lateral walls 128 may be spaced apart by a distance somewhat larger than a width of a substrate 180 to be processed, e.g. its width plus 0.5-3 mm. Accordingly, the tunnel walls 122, 128, 142 may define and bound an elongate process tunnel space 104 having a relatively small volume per unit of tunnel length, and capable of snugly accommodating one or more substrates 180 that are successively arranged in the longitudinal direction T of the tunnel 102.

Both the lower tunnel wall 122 and the upper tunnel wall 142 may be provided with a plurality of gas injection channels 124, 144. The gas injection channels 124, 144 in either wall 122, 142 may be arranged as desired as long as at least a number of them is dispersed across the length of the process tunnel 102. Gas injection channels 124, 144 may, for example, be disposed on the corners of an imaginary rectangular grid, e.g. a 25 mm×25 mm grid, such that gas injection channels are regularly distributed over an entire inner surface of a respective tunnel wall 122, 124, both in the longitudinal and lateral direction thereof.

The gas injection channels 124, 144 may be connected to gas sources, preferably such that gas injection channels in a same tunnel wall 122, 142 and at a same longitudinal position thereof are connected to a gas source of a same gas or gas mixture. For ALD-purposes, the gas injection channels 124, 144 in at least one of the lower wall 122 and the upper wall 142 may, viewed in the transport direction T, be successively connected to a first precursor gas source, a purge gas source, a second precursor gas source and a purge gas source, so as to create a functional ALD-segment 108 (see FIG. 1) that in use comprises successive tunnel-wide gas zones including a first precursor gas, a purge gas, a second precursor gas and a purge gas, respectively. It is understood that one such an ALD-segment 108 corresponds to a single ALD-cycle. Accordingly, multiple ALD-segments 108 may be arranged in succession in the transport direction T to enable the deposition of a film of a desired thickness. Different ALD-segments 108 within a process tunnel 102 may, but need not, comprise a same combination of precursors. Differently composed ALD-segments 108 may for example be employed to enable the deposition of mixed films.

Whether opposing gas injection channels 124, 144, which share a same longitudinal position of the process tunnel but are situated in opposite tunnel walls 122, 142, are connected to gas sources of a same gas composition may depend on the desired configuration of the apparatus 100. In case double-sided deposition is desired, i.e. ALD treatment of both a lower surface 180a and an upper surface 180b of a substrate 180 travelling through the process tunnel 102, opposing gas injection channels 124, 144 may be connected to a same gas source. Alternatively, in case only single-sided deposition is desired, i.e. ALD treatment of merely one of the lower surface 180a and upper surface 180b of a substrate 180, gas injection channels 124, 144 in the tunnel wall 122, 142 facing the substrate surface to be treated may be alternatingly connected to a reactive and an inert gas source, while gas injection channels in the other tunnel wall may all be connected to an inert gas source.

In the exemplary embodiment of FIGS. 1-3, the gas injection channels 144 in the upper wall 142 are successively connected to a trimethylaluminum (Al(CH$_3$)$_3$, TMA) source, a nitrogen (N$_2$) source, a water (H$_2$O) source, and a nitrogen source, so as to form a series of identical ALD-segments 108 suitable for performing aluminum oxide (Al$_2$O$_3$) atomic layer deposition cycles. The gas injection channels 124 in the lower tunnel wall 122, in contrast, are all connected to a nitrogen source. Accordingly, the exemplary apparatus 100 is set up to maintain lower non-depositing gas bearing 126 and an upper depositing gas bearing 146, together configured to perform single-sided deposition on a top surface 180b of a passing, floatingly supported substrate 180.

Each of the lateral walls 128 of the process tunnel 102 may, along its entire length or a portion thereof, be provided with a plurality of gas exhaust channels 130. Alternatively, the gas exhaust channels may be provided in at least one of the upper and the lower tunnel wall directly adjacent both lateral walls. In this respect "directly adjacent" means within a distance of less than 2 mm from the respective lateral wall. The gas exhaust channels 130 may be spaced apart preferably equidistantly in the longitudinal direction of the process tunnel 102. The distance between two neighboring or successive gas exhaust channels 130 in or directly adjacent a same lateral wall 128 may be related to a length of the substrates 180 to be processed; in this text, the 'length' of a typically rectangular substrate 180 may be construed as the dimension of the substrate extending in the longitudinal direction T of the process tunnel 102. A lateral wall portion the length of a substrate 180 may preferably comprise between approximately 5 and 20, and more preferably between 8 and 15, exhaust channels 130. A center-to-center distance between two successive gas exhaust channels 130 may be in the range of approximately 10-30 mm. For reasons of substrate stabilization, the configuration of gas exhaust channels 130 in or directly adjacent the two lateral walls 128 may preferably be identical or mirror symmetric, such that each gas exhaust channel 130 in or directly adjacent one lateral wall 128 faces a gas exhaust channel 130 in or directly adjacent the other, opposite lateral wall 128.

The gas exhaust channels 130 may be connected to and discharge into gas exhaust conduits 110, which may be provided on the outside of the process tunnel 102. In case the apparatus 100 is set up to perform ALD, the exhaust gases may contain quantities of unreacted precursors. Accordingly, it may be undesirable to connect gas exhaust channels 130 associated with mutually different reactive gas zones to a same gas exhaust conduit 110 (which may unintentionally lead to chemical vapor deposition). Different gas exhaust conduits 110 may thus be provided for different precursors.

The general operation of the apparatus 100 may be described as follows.

In use, the lower and upper tunnel bodies 120, 140 may be in the closed configuration, and the gas injection channels 124, 144 in both the lower and upper tunnel walls 122, 142 may inject gas into the process tunnel space 104. To prevent contaminating gas flows from a typically atmospheric clean room environment 300 of the process tunnel 102 into the process tunnel space 104, e.g. at the entrance and the exit of the process tunnel 102, the process tunnel space 104 may preferably be kept at a slightly super-atmospheric pressure. Accordingly, gas injection may take place at an overpressure (relative to atmospheric pressure) on the order of several millibars. In case a somewhat smaller overpressure is maintained in the gas exhaust conduits 110, gas injected into the tunnel space 104 will naturally flow sideways, transverse to the longitudinal direction T of the process tunnel, and towards and through the gas exhaust channels 130 in or directly adjacent the lateral tunnel walls 108 that connect to the exhaust conduits 110.

In case a substrate 180 is present between the upper and lower tunnel walls 122, 142, the gas(es) injected into the tunnel space 104 by the gas injection channels 144 in the upper tunnel wall 142 may flow sideways between the upper tunnel wall 142 and a top surface 180b of the substrate 180. These lateral gas flows across a top surface 180b of the substrate 180 effectively provide for an upper gas bearing 146. Likewise, the gas(es) injected into the tunnel space 104 by the gas injection channels 124 in the lower tunnel wall 122 will flow sideways between the lower tunnel wall and a lower surface 180a of the substrate 180. These lateral gas flows across the lower surface 180a of the substrate 180 effectively provide for a lower gas bearing 126. The lower and upper gas bearings 126, 146 may together encompass and (double-) floatingly support the substrate 180.

As the substrate 180 moves through the process tunnel 102, its surfaces 180a, 180b may be subjected to the gases of the gas bearings 126, 146. Accordingly, when the apparatus 100 is setup for ALD, for instance like the apparatus depicted in FIGS. 1-3, its upper surface 180b may be strip-wise subjected to the gases present in each of the successively arranged gas zones of the upper gas bearing 146. Provided that the arrangements of the zones and the respective gases are chosen properly, traversal of one ALD-segment 108 may be equivalent to subjecting the substrate 180 to one atomic layer deposition cycle. Since the tunnel 102 may comprise as many ALD-segments 108 as desired, a film of arbitrary thickness may be grown on the substrate 180 during its crossing of the tunnel. The linear nature of the process tunnel 102 further enables a continuous stream of substrates 180 to be processed, thus delivering an atomic layer deposition apparatus 100 with an appreciable throughput capacity.

Unfortunately, the linear nature of the process tunnel 102 also entails that the processing of substrates 180 is halted in case a substrate 180 gets stuck or breaks inside the process tunnel. In such an event, the tunnel bodies 120, 140 may be separated or disjoined and be brought into their open configuration (FIG. 3) in order to allow an operator to access the interior of the process tunnel 102 via the access openings 106, and to remove the broken or stuck substrate 180. Once the problem has been remedied, the tunnel bodies 120, 140 may be rejoined, and operation may be continued.

Although the joins 160 between the lower and upper tunnel bodies 120, 140 advantageously enable the spatial separation of the bodies, they may also introduce a further problem: despite precautions, it may be both hard and costly to guarantee the fluidtightness of the joins 160. In practice, the joins 160 may form leaks through which gas may be exchanged between the process tunnel space 104 and a clean room environment 300 accommodating the process tunnel 102. In case the process tunnel space 104 is maintained at an overpressure relative to the environment 300 (see above), such leaks may cause contamination of the environment with process gases. In addition, the uncontrolled leakage of process gases from the process tunnel space 104 may cause uncontrolled local pressure variations within the process tunnel space 104, which may seriously hamper the transport of substrates 180 therethrough.

Figure 4:
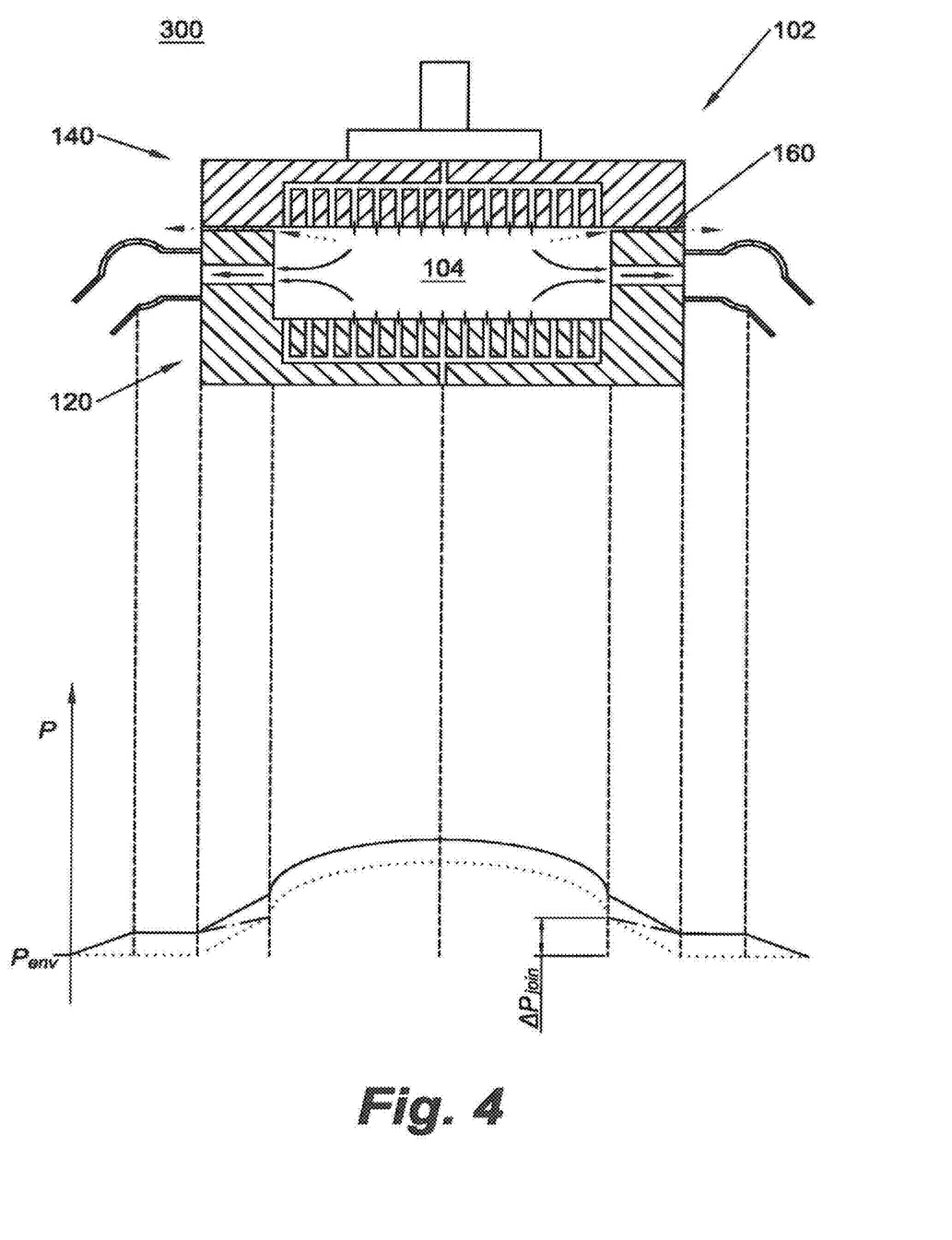
FIG. 4 schematically illustrates a lateral cross-sectional side view of the process tunnel section shown in FIG. 1, wherein the upper and lower tunnel bodies are in a closed, yet leaking configuration.

The effect of leaking joins 160 on the pressure distribution inside the process tunnel 102 may be illustrated with reference to FIG. 4. At the top, FIG. 4 shows a schematic lateral cross-sectional side view of the process tunnel 102. The lower and upper tunnel bodies 120, 140 are in a closed configuration, but the joins 160 are not fluidtight. As a result, process gases injected into the tunnel space 104 flow sideways, and exit the tunnel space 104 through both the gas exhaust channels 130 in or directly adjacent the lateral tunnel walls 128 (solid arrows) and the leaking joins 160 (dotted arrows). At the bottom, FIG. 4 show a pressure diagram including two primary pressure curves. The solid curve represents a reference pressure distribution for the non-depicted situation in which the joins 160 are fluidtight; the solid curve thus indicates the pressure inside the process tunnel space 104 and through the gas exhaust channels 130. The dotted curve represents the pressure distribution for the depicted situation with leaking joins 160, and indicates the pressure inside the process tunnel space 104 and through the leaking joins 160. Two secondary, short dot-dashed pressure curves interconnecting the dotted and solid curves indicate the pressure distribution through the gas exhaust channels 130 for the depicted situation with leaking joins 160. On the vertical pressure (P) axis of the diagram, Penv indicates the pressure level of the environmental pressure.

The solid pressure curve indicates that the gas pressure at the lateral center of the process tunnel space 104 is highest, and drops towards the gas exhaust conduits 110. Within the gas exhaust conduits 110, the pressure may fall off further until it eventually reaches environmental pressure $P_{env}$, typically at the end of the gas exhaust conduit. In the case of leaking joins 160, process gas may escape from the process tunnel space 104. Compared to the non-leaking case, the leaking joins may cause a drop in the overall pressure distribution, as indicated by the dotted pressure curve. Note that the drop appears rather neat because the dotted pressure curve relates to the depicted situation with two mirror symmetrically leaking joins 160. In case the two joins 160 would leak in a different, non-symmetrical manner, the dotted curve would no longer be symmetrical around its center, but for instance appear subsided to the side of the largest leak.

As mentioned, the deviation of the dotted pressure curve from the solid pressure curve may pose problems for the transport of contactlessly advanced, double-floatingly supported substrates 180. For instance, in case the joins 160 are leaking over a certain longitudinal portion of the process tunnel, a floatingly supported substrate 180 would be accelerated upon entering this longitudinal portion, and decelerated upon leaving it. In case the joins 160 leaks too much, the substrate 180 may even come to a complete stop. Similarly, in case only one of the joins 160 is leaking, or the opposite joins 160 are leaking non-(mirror) symmetrically, the pressure adjacent one of the lateral tunnel walls 128 would be greater than that adjacent the opposite lateral tunnel wall 128. Consequently, a substrate 180 passing the leaking join(s) 160 would be destabilized and forced sideways, towards and possibly into contact with the lateral wall 128 adjacent the region of smallest pressure.

Since attempts to conventionally seal the joins 160 by means of sealing materials like O-rings are either impractical or uneconomical, the present disclosure suggests a different approach to solve the problem of uncontrolled leakage of gases into/from the process tunnel space 104 caused by the presence of the leaking joins 160. To enable this approach, the joins 160 may be arranged such that they do not intersect the gas exhaust channels 130 provided in the lateral tunnel walls 128 or in at least one of the upper and the lower tunnel wall directly adjacent the lateral tunnel walls 128. By ensuring that the gas exhaust channels 130 are not intersected by joins 160, a fluidtight connection between the gas exhaust channels 130 and the gas exhaust conduit(s) 110 is facilitated. Moreover, isolating the gas exhaust channels 130 from the joins 160 enables the pressure drops across the joins 160 to be controlled independently from the pressure drops across the gas exhaust channels.

This latter aspect is key to two elaborations of the presently disclosed apparatus 100 in which pressure regulation means are provided, configured to equalize gas pressures on opposite sides of a join 160, such that a pressure drop $\Delta P_{join}$ across the join obeys $\Delta P_{join} \approx 0$. It is understood that the pressure drop across the join $\Delta P_{join}$ is the difference between a gas pressure on an inside of the join 160, i.e. a gas pressure inside the process tunnel space 104, and a gas pressure on an outside of the join 160, i.e. a gas pressure outside of the process tunnel space 104, e.g. an environmental gas pressure Pent) When the pressure drop across the join 160 is successfully reduced to zero or at least approximately zero (i.e. '≈0', which may be quantified to mean '<10 Pascals'), there is substantially no pressure difference across the join 160 to drive a gas flow. Consequently, there is effectively no leak either.

A first elaboration may be illustrated with reference to FIG. 5. In this elaboration, the pressure drop $\Delta P_{join}$ across a longitudinal, non-fluidtight part of the join 160 may be controlled by exercising control over a pressure on an inside of said part of the join, and more specifically by controlling a pressure inside a gas exhaust channel 130 adjacent said part of the join.

To this end, the pressure regulation means may include a gas pump 200. The term 'gas pump' as used here may be construed broadly to include relatively economical devices such as extractor fans, ventilators and the like. The gas pump 200 may be associated with a gas exhaust channel 130 that is arranged longitudinally adjacent or near e.g. within several centimeters, for instance within 100 mm and preferably 50 mm, of the non-fluidtight part of the join 160. The gas pump 200 may, for instance, be arranged inside the gas exhaust conduit 110 that connects to the gas exhaust channel, and be adapted to control a gas pressure inside the gas exhaust channel 130 with which it is associated, in particular the gas pressure at an upstream entrance thereof. Because of its association with the gas pump 200, the gas exhaust channel 130 in question may be referred to as a 'controlled gas exhaust channel'.

The pressure regulation means may further include a pressure control system 202, which may be configured to control the pressure inside the controlled gas exhaust channel 130 by controlling the gas pump 200, so as to locally effect a condition $\Delta P_{join} \approx 0$ adjacent the controlled gas exhaust channel. The pressure control system 202 may typically include a differential pressure sensor 204a, 204b that is associated with the controlled gas exhaust channel 130 and configured to monitor a pressure difference between a first location inside the process tunnel space 104, normally located near to both the non-fluidtight part of the join 160 and the controlled gas exhaust channel 130, and a second location outside the process tunnel space 104 (i.e. in the environment of the process tunnel 102), and to generate a signal reflecting the pressure difference. It is understood that the differential pressure sensor may thus include two spaced apart pressure sensors 204a and 204b, as schematically depicted in FIG. 5. The pressure control system may also comprise a controller 206. The controller 206 may be operably connected to both the differential pressure sensor 204a, 204b and the gas pump 200, and be configured to control the gas pump in dependence of the signal received from the differential pressure sensor, so as to locally effect the condition $\Delta P_{join} \approx 0$ adjacent the controlled gas exhaust channel 130.

Figure 5:
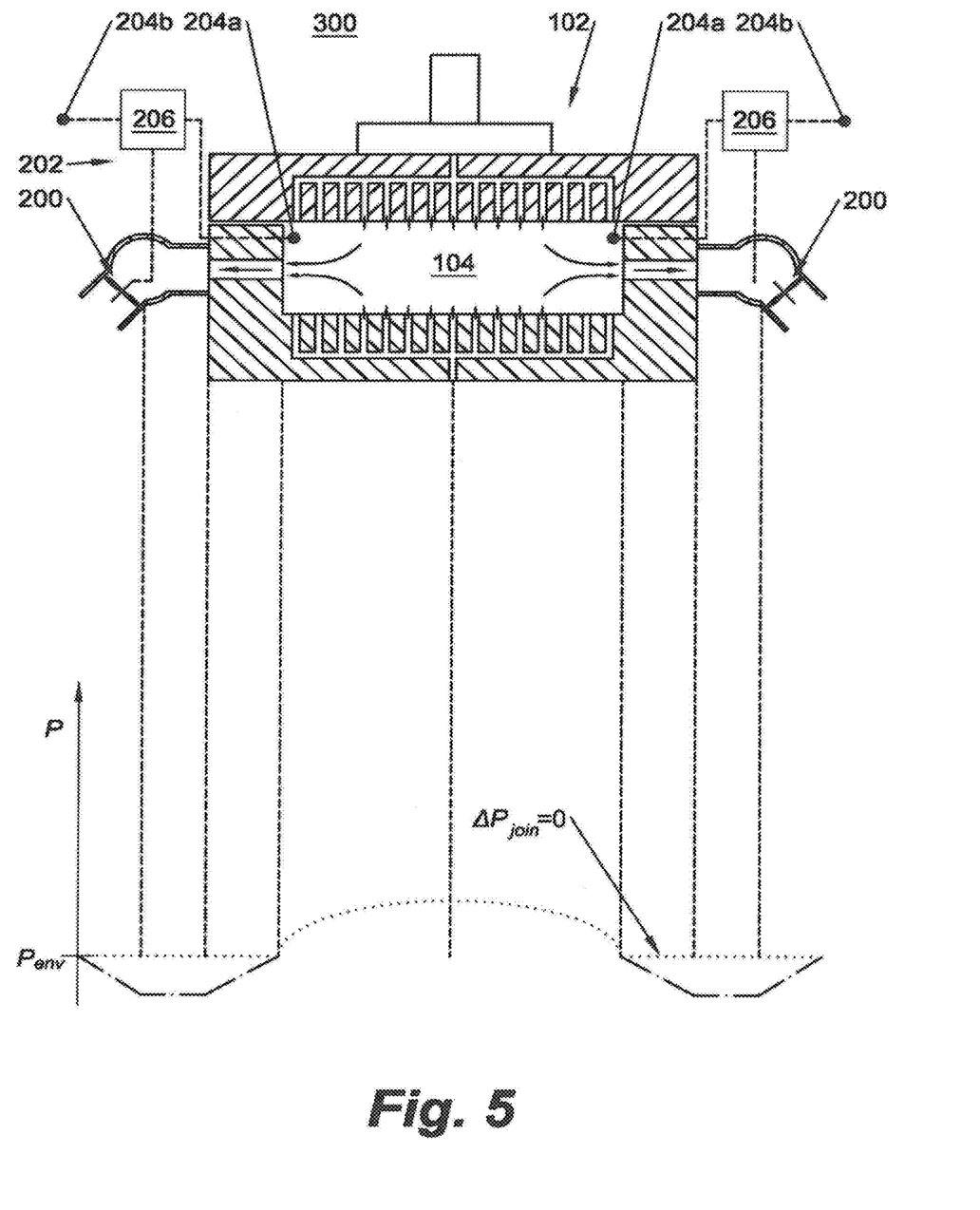
FIG. 5 schematically illustrates a lateral cross-sectional side view of a first elaboration of the substrate processing apparatus shown in FIGS. 1-3, including pressure regulation means configured to equalize pressures on opposite sides of the joins.

The diagram at the bottom of FIG. 5 shows a dotted pressure curve that represents the pressure distribution for the depicted situation with non-fluidtight joins 160, and indicates the pressure inside the process tunnel space 104 and through the joins 160. The secondary dot-dashed pressure curves indicate the pressure distribution through the gas exhaust channels 130 and gas conduits 110.

A second elaboration may be illustrated with reference to FIG. 6. In this elaboration, the pressure drop $\Delta P_{join}$ across a longitudinal, non-fluidtight part of the join 160 may be controlled by exercising control over a pressure on an outside of the join 160.

To this end, the pressure regulation means may comprise an auxiliary containment 210 that defines a buffer space 211 configured to contain a preferably inert, pressurized buffer gas such as nitrogen ($N_2$), which buffer space is in fluid communication with (an outside of) the part of the join 160 across which the pressure drop is to be controlled. In some embodiments, the auxiliary containment may take the shape of an elongate box- or channel-like structure that extends outside of and along the lateral walls 128 of the process tunnel 102, as schematically shown in FIG. 6. In one embodiment, the auxiliary containment may include at least two wall parts, one of which is fixedly connected to the lower tunnel body 120, and one of which is fixedly connected to the upper tunnel body 140. This allows the respective wall parts to move apart with the respective tunnel bodies 120, 140 when they assume their open configuration, while it allows the respective wall parts to mate and define the buffer space when the tunnel bodies assume their closed configuration. In another embodiment, the auxiliary containment may simply be connected to one of the tunnel bodies 120, 140. As regards the relative movability of the tunnel bodies 120, 140 and the secondary containment 210 and the sealing between them, it is worth noting that the buffer space 211 defined by the auxiliary containment 210 need not be completely fluidtight. That is, the construction of the auxiliary containment 210 and/or its connections to the process tunnel 102 may include leaks, as long as the pump 212 used to pressurize the buffer gas in the buffer space 211 (see below) is capable of maintaining the buffer gas at a desired bulk pressure necessary to maintain the condition $\Delta P_{join} \approx 0$.

As mentioned, the pressure regulation means may further include a gas pump 212. The term 'gas pump' as used here may be construed broadly to include devices (gas) compressors and the like. The gas pump 212 may, on the one hand, be operably connected to a source of a suitable, preferably inert buffer gas, and, on the other hand, to the secondary containment 210, so as to be able to pressurize the buffer space 211 with said buffer gas.

The gas pump 212 may typically operate under the control of a pressure control system 214 that is configured to control a pressure of the buffer gas inside the buffer space 211 by controlling the gas pump 212, so as to effect and maintain the desired condition $\Delta P_{join} \approx 0$. The pressure control system may, for instance, include a differential pressure sensor 216a, 216b that is configured to monitor a pressure difference between a first location inside the process tunnel space 104 and a second location inside the buffer space 211, and to generate a signal reflecting the pressure difference. The pressure control system may also include a controller 218 that is operably connected to both the differential pressure sensor 216a, 216b and the gas pump 212, and configured to control the gas pump in dependence of the signal received from the differential pressure sensor, so as to an approximately zero pressure drop across the join 160.

Figure 6:
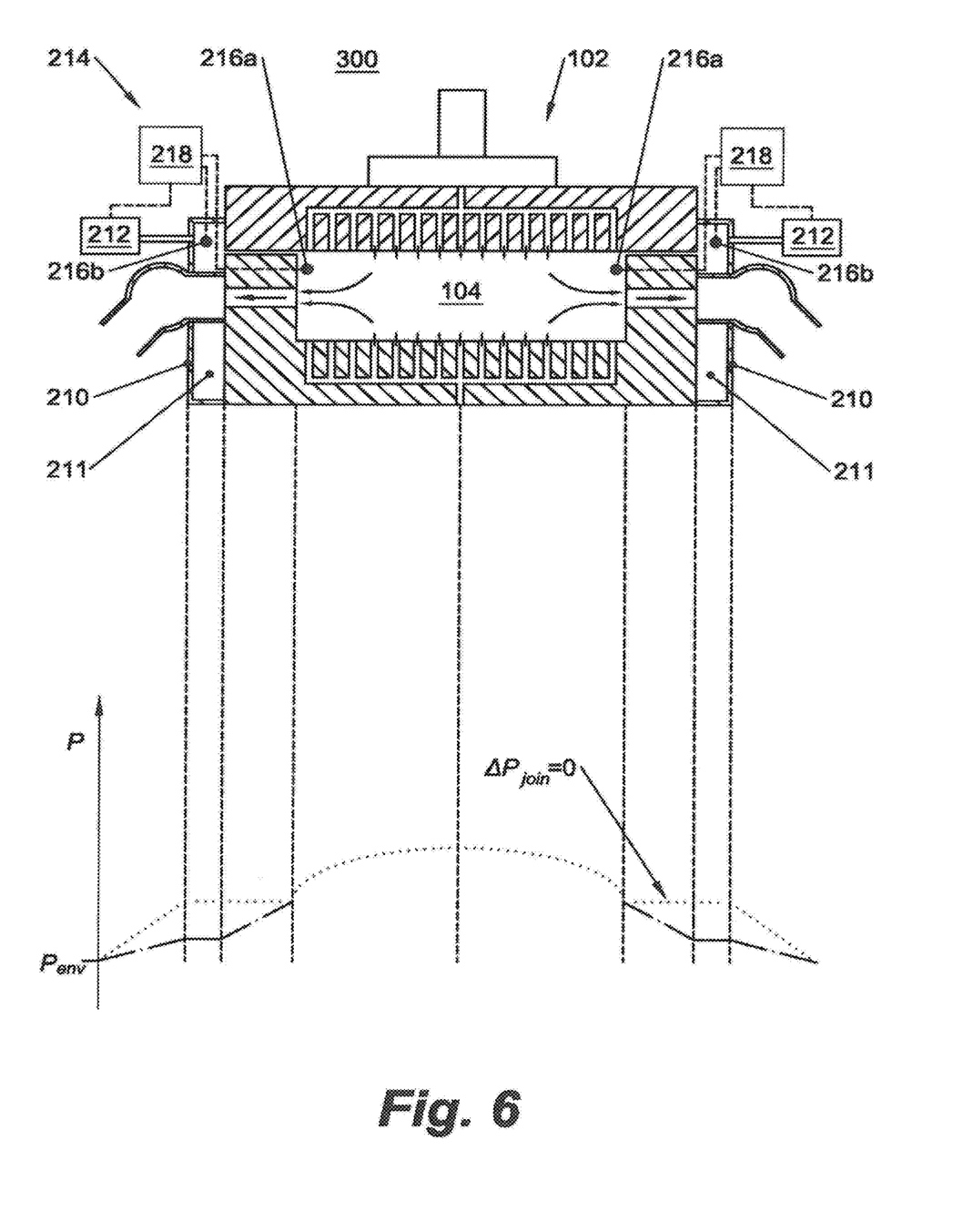
FIG. 6 schematically illustrates a lateral cross-sectional side view of a second elaboration of the substrate processing apparatus shown in FIGS. 1-3, including pressure regulation means configured to equalize pressures on opposite sides of the joins.

As in FIG. 5, the diagram at the bottom of FIG. 6 shows a dotted pressure curve that represents the pressure distribution for the depicted situation with non-fluidtight joins 160, and indicates the pressure inside the process tunnel space 104 and through the joins 160. The secondary dot-dashed pressure curves indicate the pressure distribution through the gas exhaust channels 130 and gas conduits 110.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

We claim:

1. A substrate processing apparatus comprising:
   a process tunnel comprising a lower tunnel body including a lower tunnel wall, an upper tunnel body including an upper tunnel wall, and two spaced lateral tunnel walls included in one of the lower and the upper tunnel bodies, said lower tunnel wall, said upper tunnel wall and said two spaced lateral tunnel walls being configured to bound a process tunnel space that extends in a longitudinal transport direction for at least 5 meters, the upper tunnel body and the lower tunnel body extending over the entire length of the process tunnel space and are unitary so as to be movable relative to each other as respective wholes, the process tunnel space being sized to accommodate at least one substantially planar substrate oriented parallel to the upper and lower tunnel walls;
   a plurality of gas injection channels provided in both the lower tunnel wall and the upper tunnel wall, wherein the gas injection channels in the lower tunnel wall are configured to provide for a lower gas bearing, the gas injection channels in the upper tunnel wall are configured to provide for an upper gas bearing, and said gas bearings are configured to floatingly support and accommodate said substrate therebetween;
   a plurality of gas exhaust channels provided in said two spaced lateral tunnel walls or provided directly adjacent both of said two spaced lateral tunnel walls in at least one of the lower and the upper tunnel wall, wherein the gas exhaust channels are spaced apart in the transport direction;
   wherein the lower tunnel body and the upper tunnel body are separably joinable to each other along at least one longitudinally extending join having a length generally corresponding to a length of the process tunnel space, the lower tunnel body and the upper tunnel body being configured to be movable with respect to each other between a closed configuration in which the upper tunnel body and the lower tunnel body bound the process tunnel space and an open configuration in which the upper tunnel body is spaced from the lower tunnel body to provide maintenance access to an interior of the process tunnel, wherein the upper tunnel body includes downward facing join surfaces, wherein the lower tunnel body includes upward facing join surfaces mateable with the downward facing join surfaces;
   wherein the substrate processing apparatus further includes a press or at least one clamp configured to force the downward facing join surfaces of the upper tunnel body and the upward facing join surfaces of the lower tunnel body in confronting abutting relation along substantially the length of the at least one longitudinally extending join in order to affect the closed configuration;
   wherein the substrate processing apparatus further comprises pressure regulation means configured to equalize pressures on opposite sides of the longitudinally extending join, such that a pressure drop $\Delta P_{join}$ across the join obeys $\Delta P_{join} \sim 0$, wherein the pressure regulation means comprises:
   a gas pump that is associated with a controlled gas exhaust conduit into which at least one of the plurality of gas exhaust channels discharges; and
   a pressure control system configured to control a gas pressure inside the controlled gas exhaust conduit by controlling the gas pump, and wherein the plurality of gas exhaust channels are adjacent to the longitudinally extending join, so as to locally affect a condition $\Delta P_{join} \sim 0$ across the longitudinally extending join;
   wherein the pressure control system includes:
   a differential pressure sensor configured to monitor a pressure difference between:

a first location inside the process tunnel space, the first location being adjacent to both the longitudinally extending join and at least one of the plurality of gas exhaust channels, and a second location outside the process tunnel space, the differential pressure sensor being operative to generate a signal reflecting the pressure difference; and a controller, operably connected to both the differential pressure sensor and the gas pump, and configured to control the gas pump in dependence upon the signal generated by the differential pressure sensor, so as to locally affect the condition $\Delta P_{join} \sim 0$;

wherein the lower tunnel body comprises the lower tunnel wall and the two spaced lateral tunnel walls formed as an integral continuous member and that the lower tunnel wall and lateral tunnel walls together define a generally U-shaped lateral cross-sectional wall profile;

wherein the downward facing join surfaces comprise flat surfaces that are co-planar with an inner surface of the upper tunnel wall and configured to abut the upward facing join surfaces in the closed configuration, so as to define the at least one longitudinally extending join, and wherein $\Delta P_{join} < 10$ Pa.

2. The substrate processing apparatus according to claim 1, wherein the press or the at least one clamp is configured to separate the upper and lower tunnel bodies at the longitudinally extending join in order to affect the open configuration.

3. The substrate processing apparatus according to claim 1, further comprising a hinge that is connected with both the upper and the lower tunnel body and that is configured to hinge the upper tunnel body relative to the lower tunnel body in order to affect the open configuration and to bring the upper and lower tunnel bodies together along the at least one longitudinally extending join in which position said press or said at least one clamp forces the upper and the lower tunnel bodies together along the at least one longitudinally extending join in order to affect the closed configuration.

4. The substrate processing apparatus according to claim 1, wherein the upper and lower tunnel walls are substantially flat, and wherein the press is configured to move the upper and lower tunnel bodies with the upper and lower tunnel walls in a parallel relationship when the substrate processing apparatus is in the closed configuration.

5. The substrate processing apparatus according to claim 1, wherein the longitudinally extending join does not intersect the plurality of gas exhaust channels provided in or directly adjacent the lateral tunnel walls.

6. The substrate processing apparatus according to claim 1, wherein the gas pump includes an extractor fan.

* * * * *